United States Patent
Okada

[11] Patent Number: 6,157,219
[45] Date of Patent: *Dec. 5, 2000

[54] AMPLIFIER FOR A SEMICONDUCTOR DEVICE AND A METHOD OF CONTROLLING THE SAME

[75] Inventor: Atsuhiko Okada, Tokyo, Japan

[73] Assignee: Oki Electric Industry Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/176,762

[22] Filed: Oct. 22, 1998

[30] Foreign Application Priority Data

Jul. 17, 1998 [JP] Japan .................................. 10-203465

[51] Int. Cl.⁷ .................................................. G01R 19/00
[52] U.S. Cl. ................................ 327/55; 327/50; 327/52; 327/63; 327/65
[58] Field of Search .................................. 327/55, 50, 51, 327/52, 63, 64, 65, 69, 560, 561, 562, 563

[56] References Cited

U.S. PATENT DOCUMENTS

| | | | |
|---|---|---|---|
| 4,845,675 | 7/1989 | Krenik et al. | 365/203 |
| 4,973,864 | 11/1990 | Nogami | 327/55 |
| 5,065,111 | 11/1991 | Tsukuda et al. | 330/253 |
| 5,192,878 | 3/1993 | Miyamoto et al. | 327/77 |
| 5,504,442 | 4/1996 | Tanoi | 327/51 |
| 5,514,986 | 5/1996 | Tanoi | 327/57 |
| 5,619,467 | 4/1997 | Sim | 365/208 |
| 5,654,928 | 8/1997 | Lee et al. | 365/205 |
| 5,699,305 | 12/1997 | Kawashima | 365/190 |
| 5,874,840 | 2/1999 | Bonaccio | 327/55 |

OTHER PUBLICATIONS

Katsuro Sasaki et al., "FA 13.2; A 7ns 140mW 1Mb CMOS SRAM with Current Sense Amplifier" 1992 IEEE International Solid–State Circuits Confernce, pp. 208 and 209.

*Primary Examiner*—Timothy P. Callahan
*Assistant Examiner*—Hai L. Nguyen
*Attorney, Agent, or Firm*—Jones Volentine, LLC

[57] ABSTRACT

In an amplifier having an input terminal to which input data is supplied and an output terminal from which output data corresponding to the input data is output, the input and output terminals are disposed between a power supply node to which a power supply is applied and a reference voltage node to which a reference voltage is applied. The output terminal and the reference voltage node are connected to each other and the input terminal and the output terminal are disconnected from each other, before the input data is supplied to the input terminal. The output terminal and the reference voltage node are disconnected from each other and the input terminal and the output terminal are connected to each other, after the input data is supplied to the input terminal.

12 Claims, 5 Drawing Sheets

AMPLIFIER FOR A SEMICONDUCTOR DEVICE AND A METHOD OF CONTROLLING THE SAME

BACKGROUND OF THE INVENTION

1. Field of the Invention

The invention relates to an amplifier for a semiconductor device and a method of controlling the same, particularly to a current sense amplifier.

2. Description of the Related Art

As a circuit for, transferring input data at high speed, it has been known to use a current sense amplifier for converting a current difference between two input data into a voltage difference and amplifying the voltage difference.

Such a current sense amplifier is reviewed in, for example, "DIGEST OF TECHNICAL PAPERS, pp. 208–209, ISSCC 92, Feb. 21, 1992."

In the conventional current sense amplifier, a current flows regularly during sensing operation, namely, while a control signal of the current sense amplifier is active. Accordingly, the current consumption of the current sense-amplifier becomes large.

Further, since a large voltage drop occurs across every MOS transistor provided between an input terminal and a ground voltage, the amplitude of the output voltage from an output terminal becomes a fraction of a power supply voltage.

SUMMARY OF THE INVENTION

It is an object of the invention to provide an amplifier capable of sharply reducing current consumption.

It is another object of the invention to provide an amplifier which is improved in noise immunity.

It is still another object of the invention to provide an amplifier capable of outputting an output voltage having an amplitude which is substantially equal to a power supply voltage.

To achieve these objects, a typical invention has the following constructions.

That is, in an amplifier having an input terminal to which input data is supplied and an output terminal from which output data corresponding to the input data is outputted, the input and output terminals are disposed between a power supply node to which a power supply is applied and a reference voltage node to which a reference voltage is applied, wherein the output terminal and the reference voltage node are connected to each other and the input terminal and the output terminal are disconnected from each other before the input data is supplied to the input terminal, and wherein the output terminal and the reference voltage node are disconnected from each other, and the input terminal and the output terminal are connected to each other after the input data is supplied to the input terminal.

According to the construction of the invention, it is possible to realize the sense amplifier which is improved in noise immunity.

According to the construction of the invention, it is possible to realize the sense amplifier capable of outputting an output voltage having an amplitude which is substantially equal to a power supply voltage.

According to the construction of the invention, it is possible to realize the sense amplifier capable of sharply reducing the current consumption.

BRIEF DESCRIPTION OF THE DRAWINGS

While the specification concludes with claims particularly pointing out and distinctly claiming the subject matter, which is regarded as the invention, it is believed that the invention, the objects and features of the invention and further objects, features and advantages thereof will be better understood from the following description taken in connection with the accompanying drawings in which:

DESCRIPTION OF THE PREFERRED EMBODIMENTS

Preferred embodiments of the invention will be now described with reference to the accompanying drawings.

The description set forth hereunder concentrates a portion directly relating to the invention, and hence the description of other portions is omitted.

A first embodiment is first described with reference to FIG. 1.

Figure 1:
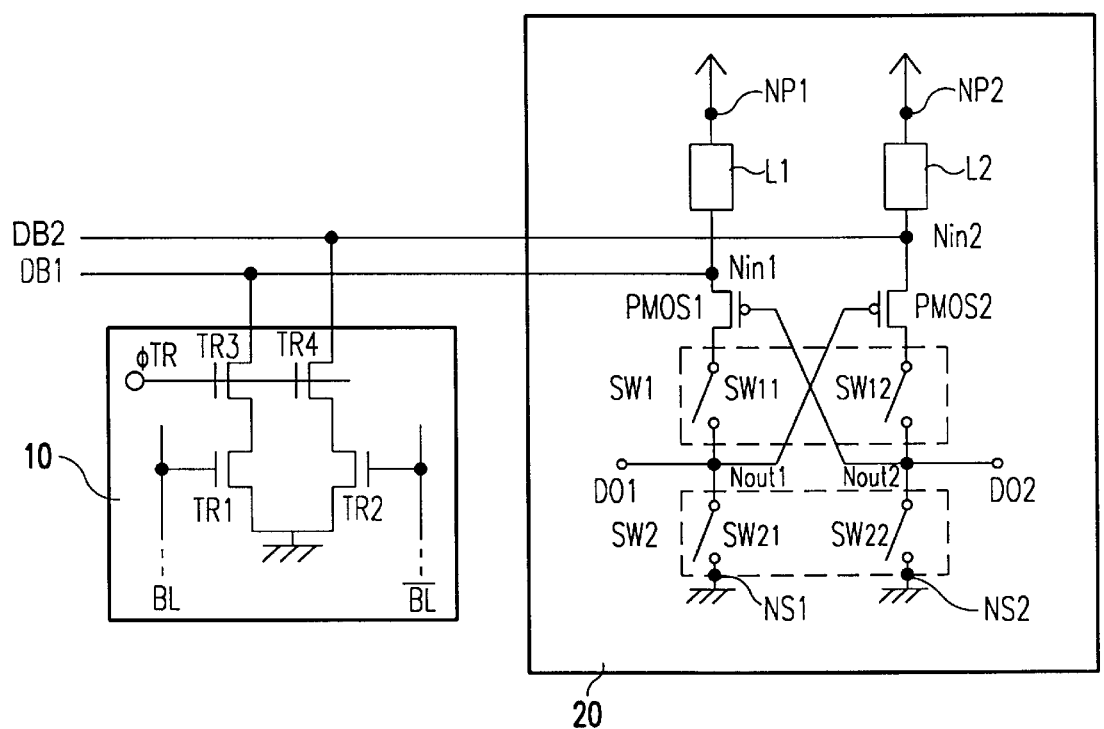
FIG. 1 is a partial circuit diagram for explaining a first embodiment of the invention.

FIG. 1 shows a transfer circuit 10 for transferring data, data buses DB1 and DB2 for transferring data from the transfer circuit 10 to an amplifier 20 wherein the amplifier 20 outputs an output voltage from output nodes based on data supplied to input nodes.

The transfer circuit 10 comprises bit line pair BL, BL to which data is supplied from a memory cell, not shown, an NMOSTR1 connected to the bit line BL at a gate electrode (hereinafter referred to as gate), to a ground at a source electrode (hereinafter referred to as source), and to a source of an n-channel MOS transistor (hereinafter referred to as NMOS)TR3 at a drain electrode (hereinafter referred to as drain) thereof, an NMOSTR2 connected to the inverted bit line BL at a gate, to a ground voltage Vss at a source, and to a source of an NMOSTR4 at a drain thereof, the NMOSTR3 having a gate to which a transfer control signal φ TR is supplied, and which is connected to a drain of the NMOSTR1 at a source, and to the data bus DB1 at a drain thereof, and the NMOSTR4 having a gate to which a transfer control signal φ TR is supplied, and which is connected to a drain of the NMOSTR2 at a source, and to the data bus DB2 at a drain thereof. The sources and drains of the NMOSs may be defined contrarily to those as mentioned above.

In the transfer circuit 10, either the NMOSTR1 or NMOSTR2 becomes ON when the transfer control signal φ TR is rendered "H level" during a data read period so that the NMOSTRs 3 and 4 become ON and an "H level" data is read from either bit line of bit line pair BL, BL.

Since the data buses DB1 and DB2 are precharged with a power supply voltage before the data read period, when data is read, the voltage on the data bus (data bus DB1 or data bus DB2) connected to either of the NMOSs (TR1 or TR2) which is ON drops. In such a manner, data from a memory cell is transferred onto the data buses. Data on the data buses are transmitted to the amplifier 20.

Since the transfer circuit 10 is not directly related to the invention, it is simply explained. The detail will be easily understood with reference to a 64M synchronous DRAM, MD56V62320, etc.: made of Old Electric Industry Co. Ltd.

The construction of the amplifier 20 of the invention is shown hereunder.

The amplifier 20 includes input nodes Nin1 and Nin2 to which input data is supplied through the data buses DB1 and DB2. Load circuits Li and L2 are respectively disposed between the input nodes Ni1, Ni2 and power supply voltage nodes Np1, Np2, to which the power supply voltage Vdd is applied from the power supply. The load circuits L1 and L2 comprise a p-channel MOS transistor (hereinafter refereed as PMOS) or a resistor. An example constituted by the PMOS will be described later.

Sources of PMOS1 and PMOS2 are respectively connected to the input nodes Nin1 and Nin2. Gates of the PMOS1 and PMOS2 are respectively connected to output nodes Nout2 and Nout1, and drains thereof are connected to a switching circuit SW1.

The switching circuit SW1 connects or disconnects between the drains of the PMOS1, PMOS2 and the output nodes Nout1, Nout2 in response to a control signal. The switching circuit SW1 may comprise a switching element SW11 which is disposed between the drain of the PMOS1 and the output node Nout1, and a switching element SW12 which is disposed between the drain of the PMOS2 and the output node Nout2. These switching elements may comprise a MOS transistor, described later.

A switching circuit SW2 is disposed between the output nodes Nout1, Nout2 and reference voltage nodes Ns1, Ns2 to which a reference voltage Vss is applied from a reference power supply. In the first embodiment, the ground voltage is used as the reference voltage.

The switching circuit SW2 connects or disconnects between the output nodes Nout1, Nout2 and the reference voltage nodes Ns1, Ns2 in response to a control signal. The control signal employed by the switching circuit SW2 is the same as the control signal which is supplied to the switching circuit SW1. If timings are realized, as described later, it is possible to suitably employ different control signals.

The switching circuit SW2 comprises a switching element SW21 which is disposed between the output node Nout1 and the reference voltage node Ns1, and a switching element SW22 which is disposed between the output node Nout2 and the reference voltage node Ns2. The switching element may comprise a MOS transistor, described later.

Output terminals DO1 and DO2 are respectively connected to the output nodes Nout1 and Nout2 so that the voltage at the output nodes is outputted outside the amplifier 20 therethrough.

The operation of the amplifier 20 is briefly explained by herein. The detailed operation will be understood from the embodiments described later.

In the amplifier 20, a precharge period is set before data is read.

Since the data buses DB1 and DB2 are precharged with the power supply voltage Vdd during the precharge period, the input nodes Nin1 and Nin2 are respectively precharged with the power supply voltage. Since the switching circuits are controlled during this period such that the switching circuit SW1 is OFF and the switching circuit SW2 is ON, the output nodes Nout1 and Nout2 are precharged with the ground voltage.

When data is read and the voltage difference is produced between the data buses DB1 and DB2, the switching circuits are controlled such that the switching circuit SW1 is ON and the switching circuit SW2 is OFF.

The voltage difference between data buses DB1 and DB2, namely, the voltage difference between the input nodes Nin1 and Nin2 is amplified by the amplifier 20 and appears at the output nodes Nout1 and Nout2.

For example, if the voltage on the data bus DB2 is lower than that on the data bus DB1, namely, the voltage at the input node Nin2 is lower than that at the input node Nin1, there occurs the difference between the voltage applied to the gate of the PMOS1 and that applied to the PMOS2. As a result, the current flowing through the source and drain of the PMOS1 is larger than that flowing through the source and drain of the PMOS2.

Accordingly, the voltage at the output node Nout1 is higher than that at the output node Nout2. As a result, the current flowing between the source and drain of the PMOS2 becomes still smaller. In such a manner, the voltage difference between the PMOS1 and PMOS2 increases further. Since the voltage at the output node Nout1 sharply increases relative to the voltage at the output node Nout2, the PMOS2 becomes OFF.

As a result, since the current from the power supply voltage Vdd is not supplied to the output node Nout2 although the voltage at the output node Nout2 becomes slightly higher, than the ground voltage, the voltage at the output node Nout2 becomes lower and close to the ground voltage. Meanwhile, since the PMOS1 remains ON, the voltage at the output node Nout1 becomes the power supply voltage.

In the first embodiment, there occurs the voltage difference which is substantially the same level as the power supply voltage (voltage difference between the power supply voltage and the ground voltage) between the output nodes Nout1 and Nout2. That is, it is possible to obtain an output having a logical amplitude which is substantially the same as the power supply voltage.

Since the switching circuits SW1 and SW2 are disposed between the power supply voltage and the ground voltage, and they are controlled such that when one of the switching circuits SW1 and SW2 is ON, the other is OFF, so that the current flowing inside the circuit is sharply reduced. The current flowing inside the circuit is very small in the amplifier of the first embodiment compared with a conventional circuit through which a current flows regularly during a sensing operation (during the activation of a control signal) although it is conceivable the presence of a transit current which flows at the instant when the switching circuit SW1 is ON.

Figure 2:
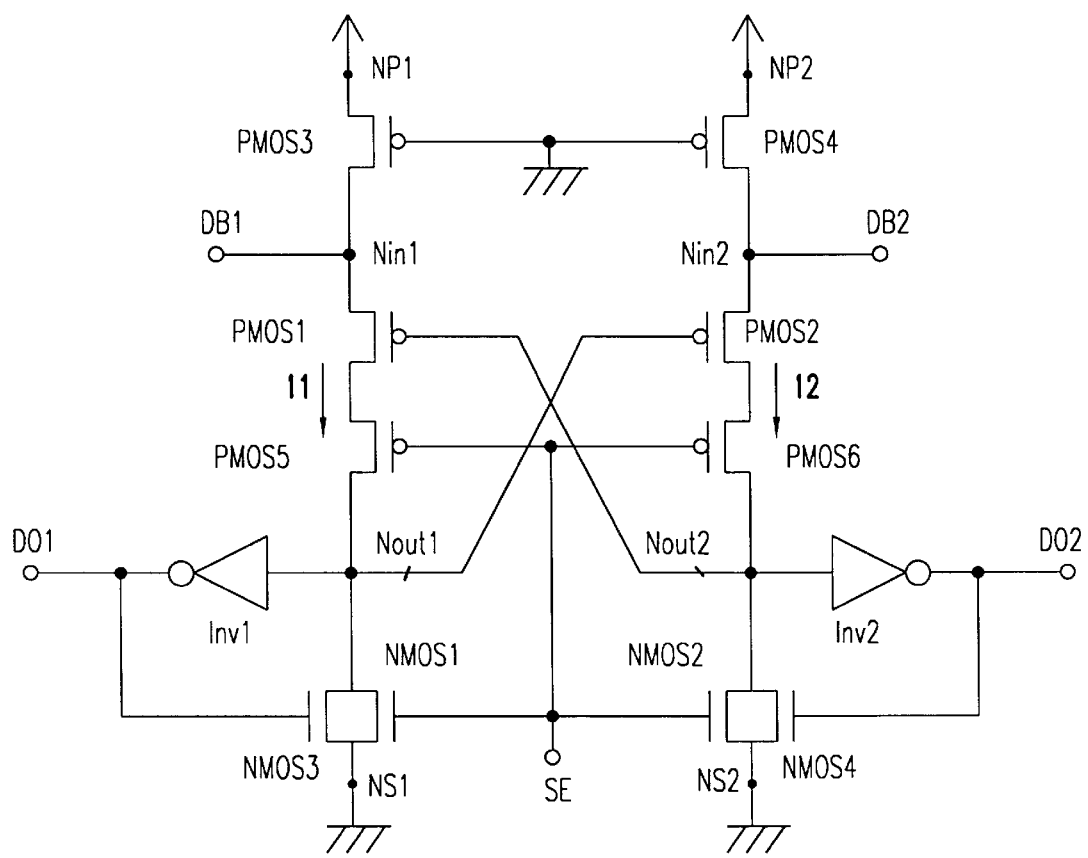
FIG. 2 is a partial circuit diagram for explaining a second embodiment of the invention.
Figure 3:
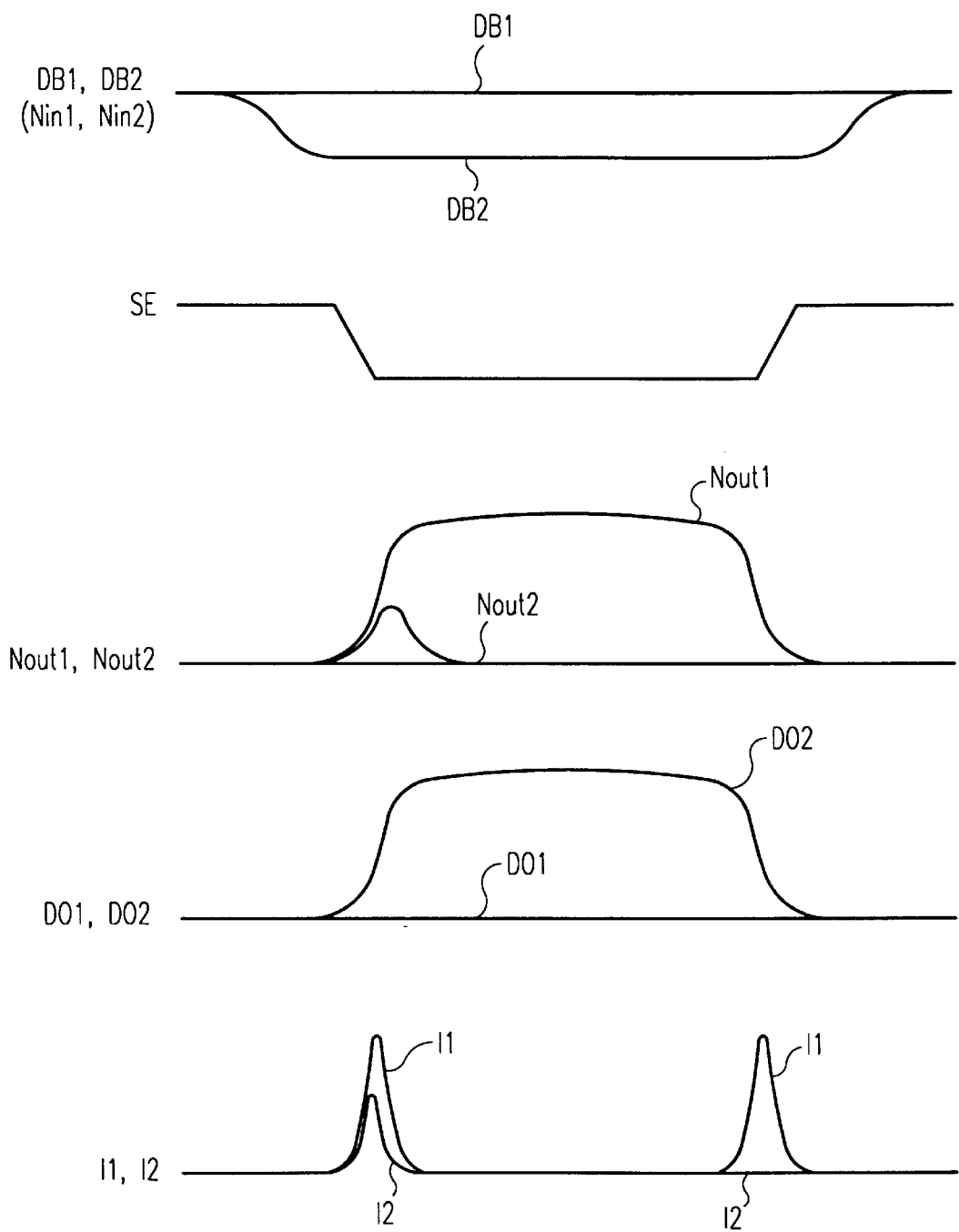
FIG. 3 is a partial timing chart showing the operation of an amplifier.

In the first embodiment of the invention, although only the fundamental portion of the invention is explained, a concrete configuration of the circuit will be explained with reference to FIGS. 2 and 3.

In this embodiment, components which are the same as those described hereinbefore are denoted by the same reference numerals and the explanation thereof may be sometimes omitted. The circuit construction and operation of the amplifier which directly relates to the invention will be described here.

An amplifier 21 includes input nodes Nin1 and Nin2 to which input data is supplied through data buses DB1 and DB2. PMOSs 3 and 4 are respectively disposed between the input nodes Nin1, Nin2 and power supply voltage nodes, Np1 and Np2 to which the power supply voltage Vdd is applied from the power supply.

Since the ground voltage Vss is applied to gates of the PMOSs 3 and 4, the PMOSs 3 and 4 are always ON to serve as a load.

Source of the PMOSs 1 and 2 are respectively connected to the input nodes Nin1 and Nin2. Gates of the PMOSs 1, and 2 are respectively connected to the output nodes Nout2 and Nout1, and drains thereof are connected to sources of PMOSs 5 and 6 serving as a switching circuit SW1.

The PMOSs 5 and 6 connect or disconnect between drains of the PMOSs 1 and 2 and output nodes Nout1 and Nout2 in response to a control signal SE which is supplied to gates thereof.

NMOSs 1 and 2 serving as a switching circuit SW2 are respectively disposed between the output nodes Nout1 and Nout2 and the reference voltage nodes Ns1 and Ns2 to which the reference voltage Vss is applied from a reference power supply.

The NMOSs 1 and 2 connect or disconnect between the output nodes Nout1, Nout2 and reference voltage nodes Ns1, Ns2 in response to the control signal SE. The control signal SE employed by the NMOSs 1 and 2 is the same as the control signal which is supplied to the PMOSs 5 and 6. Accordingly, it is controlled such that when the PMOSs 5 and 6 are ON, the NMOSs 1 and. 2 are OFF while when the PMOSs, 5 and 6 are OFF, the NMOSs 1 and 2 are ON.

Output terminals DO1 and DO2 are respectively connected to the output nodes Nout1 and Nout2 through inverters Inv1 and Inv2 so as to output the voltage at the output, nodes outside the amplifier 21. These inverters are respectively CMOS inverters.

The inverters Inv1 and Inv2 are connected to the output nodes Nout1 and Nout2 at input terminals thereof and connected to the output terminals DO1, DO2 and gates of the NMOSs 3 and 4 at output terminals thereof.

The NMOSs 3 and 4 are respectively connected between the output nodes Nout1, Nout2 and the reference voltage nodes Ns1, Ns2 in parallel with the NMOSs 1 and 2.

Next, the operation of the amplifier 21 will, be explained with reference to a timing chart in FIG. 3. In FIG. 3, denoted by "H level" is a power supply voltage and denoted by "L level" is a ground voltage.

In the amplifier 21, a precharge period is set before data is read. Since the data buses DB1 and DB2 are precharged with the power supply voltage Vdd during the precharge period, the input nodes Nin1 and Nin2 are precharged with the power supply voltage. Since, the control signal SE is "H level" also during this period, the PMOSs 5 and 6 are OFF but the NMOSs 1 and 2 are ON. Accordingly, the output nodes Nout1 and Nout2 are respectively precharged with "L level".

If data is read and the voltage difference occurs between the data buses DB1 and DB2, the control signal SE becomes "L level". Accordingly, the PMOSs 5 and 6 become ON but the NMOSs 1 and 2 become OFF.

The voltage difference between the data buses DB1 and DB2, namely, the voltage difference between input nodes Nin1 and Nin2 is amplified by a differential amplifier 21, and appears at the output nodes Nout1 and Nout2.

If the voltage on the data bus DB2 is lower than that on the data bus DB1, namely, the voltage at the input node Nin2 is lower than that at the input node Nin1, there occurs the difference between the voltage applied to the gate of the PMOS1 and that applied to the gate of the PMOS2. Accordingly, the current flowing between the source and drain of the PMOS1 is larger than that flowing through the source and drain of the PMOS2.

Accordingly, the voltage at the output node Nout1 is higher than that at the output node Nout2. As a result, the current flowing through the source and drain of the PMOS2 becomes still smaller. The current difference between the PMOSs 1 and 2 is further increased. Since the voltage at the output node Nout1 sharply increases relative to that at the output node Nout2, the PMOS2 becomes OFF. As a result, a current I2 flowing through the output node Nout2 is cut off.

Since the voltage ("L level" ) at the output node Nout2 is inverted by the inverter Inv2 so that "H level" signal is supplied to a gate of the NMOS4, so that the NMOS4 becomes ON. As a result, the voltage at the output node Nout2 is fixed to "L level".

Since when the voltage at the output node Nout1 increases, the output of the inverter Inv1 is changed to "L level", the NMOS3 becomes OFF. As a result, a current I1 flowing through the output node Nout1 is cut off. Consequently, the voltage at the output node Nout1 is fixed to "H level".

When the voltages at the, output nodes Nout1 and Nout2 are respectively fixed in such a manner, the current paths thereof are naturally cut off, thereby restraining a feedthrough current.

The second embodiment explained, the case where the output node Nout1 is at "H level" and the output node Nout2 is at "L -level", namely, "L level" data is outputted from the output terminal DO1 and "H level" data is outputted from the output terminal DO2.

It is easily understood that in the alternative, when the output node Nout1 is at "L level" and the output node Nout2 is at "H level", namely, "H level" data is outputted from the output terminal DO1 and "L level" data is outputted from the output terminal DO2.

That is, when the voltages at the output nodes Nout1 and Nout2 are fixed, the PMOS1 and the NMOS4 become respectively OFF, and hence the current paths thereof are naturally cut off, thereby restraining a feedthrough current.

In the second embodiment, there occurs a voltage difference between the output node Nout1 and the output node Nout2 which difference is substantially the same as the power supply voltage (voltage difference between the power supply voltage and ground voltage). That is, it is possible to obtain an output having a logical amplitude which is substantially the same as the power supply voltage.

Since the switching circuits SW1 and SW2 are disposed between the power supply voltage and the ground voltage in the same manner as the first embodiment, wherein they are controlled such that when one of the switching circuits SW1 and SW2 is ON, the other is OFF, so that the current flowing in the circuit is sharply reduced. The amount of current flowing in the circuit of the amplifier of the second embodiment is very small compared with the conventional circuit through which a current flows regularly during a sensing operation (during the activation of a control signal) although it is conceivable the presence of a transit current which flows at the instant when the switching circuit SW1 is ON.

Further, since there exist current paths until the voltages at the output nodes are fixed by the NMOSs 3 and 4 which are controlled by the outputs of the inverters Inv1 and Inv2, the noise immunity at the output terminals DO1 and DO2 improves.

Figure 4:
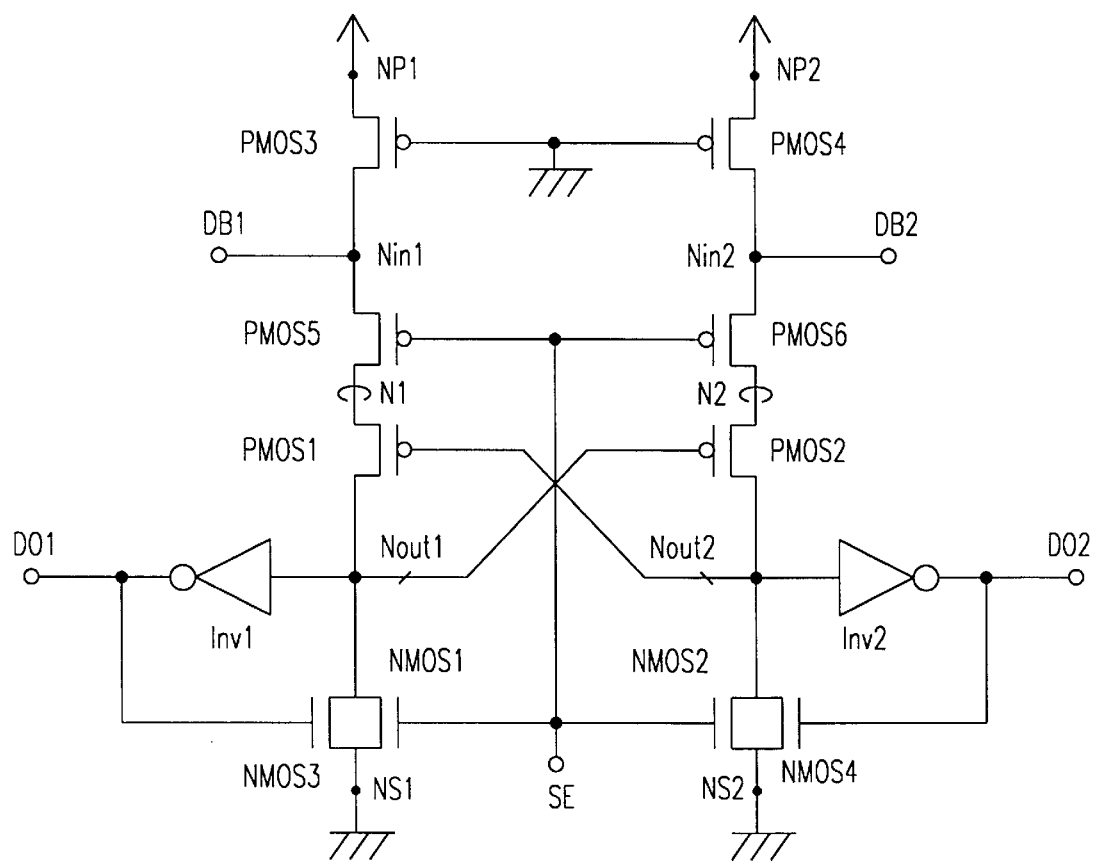
FIG. 4 is a partial circuit diagram for explaining a third embodiment of the invention.

An amplifier for a semiconductor device and a method of controlling the same according to a third embodiment of the invention will be now described hereinafter with respect to FIG. 4. In the third embodiment, components which are the same as those in the first and second embodiments are denoted by the same reference numerals, and explanation thereof may be sometimes omitted. The circuit construction and the operation of the amplifier which directly relates to the invention will be explained.

A An amplifier 22 includes input nodes Nin1 and Nin2 to which input data is supplied through data buses DB1 and DB2. PMOSs 3 and 4 are respectively disposed between the input nodes Nin1, Nin2 and the power supply voltage nodes Np1 and Np2 to which a power supply voltage Vdd is applied from the power supply. Since the reference voltage Vss is applied to gates of the PMOSs 3 and 4, the PMOSs 3 and 4 are always ON to serve as a load.

Sources of the PMOSs 5 and 6 are respectively connected to the input nodes Nin1 and Nin2. Drains of the PMOSs 5 and 6 are respectively connected to sources of PMOSs 1 and 2. The PMOSs 5 and 6 connect or disconnect between the input nodes Nin1, Nin2 and the sources of PMOSs 1 and 2 in response to a control signal SE which is supplied to gates of the PMOSs 5 and 6.

The PMOSs 1 and 2 are connected between the drains of PMOSs 5, 6 and the output nodes Nout1, Nout2. The gates of PMOSs 1 and 2 are respectively connected to the output nodes Nout2 and Nout1.

NMOSs 1 and 2 serving as a switching circuit SW2 are respectively disposed between the output nodes Nout1 and Nout2 and the reference voltage nodes. Ns1 and Ns2 to which the reference voltage Vss is applied from a reference power supply.

The NMOSs 1 and 2 connect or disconnect between the output nodes Nout1, Nout2 and reference voltage nodes Ns1, Ns2 in, response to the control signal SE. The control signal SE employed by the NMOSs 1 and 2 is the same as the control signal supplied to the PMOSs 5 and 6. Accordingly, it is controlled such that, when the PMOSs 5 and 6 are ON, the NMOSs 1 and 2 are OFF while when the PMOSs 5 and 6 are OFF, the NMOSs 1 and 2 are ON.

Output terminals DO1 and DO2 are respectively connected to the output nodes Nout1 and Nout2 through inverters Inv1 and Inv2 so as to output the voltage at the output nodes outside the amplifier 22. These inverters are respectively CMOS inverters.

The inverters Inv1 and Inv2 are connected to the output nodes Nout1 and Nout2 at input terminals thereof and connected to the output terminals DO1, DO2 and gates of NMOSs 3 and 4 at output terminals thereof.

The NMOSs 3 and 4 are respectively connected between the output nodes Nout1, Nout2 and the reference voltage nodes Ns1, Ns2 in parallel with the NMOSs 1 and 2.

Next, the operation of the amplifier 22 will be also explained with reference to the timing chart in FIG. 3. In FIG. 3, denoted by "H level" is a power supply voltage and denoted by "L level"is a ground voltage.

Also in the amplifier 22, a precharge period is set before data is read. Since the data buses DB1 and DB2 are precharged with the power supply voltage Vdd during the precharge period, the input nodes Nin1 and Nin2 are precharged with the power supply voltage. Since the control signal SE is "H level" also during this period,, the PMOSs 5 and 6 become OFF but the NMOSs 1 and 2 become ON. Accordingly, the output nodes Nout1 and Nout2 are respectively precharged with "L level".

If data is read and the voltage difference occurs between the data buses DB1 and DB2, the control signal SE becomes "L level". Accordingly, the PMOSs 5 and 6 become ON but the NMOSs 1 and 2 become OFF.

The voltage difference between the data buses DB1 and DB2, namely, the voltage difference between the input nodes Nin1 and Nin2 is amplified by the differential amplifier 22, and appears at the output nodes Nout1 and Nout2.

The third embodiment-is different from the second embodiment in that the PMOSs 5 and 6 serving as the first switching circuit function as an amplifier in the third embodiment. Since the control signal SE becomes "L level" and the PMOSs 5 and 6 become ON, the PMOSs 5 and 6 function as a so-called gate grounded type amplifier. That is, since the PMOSs 5 and 6 contribute to the amplifying operation, an amplifier having higher sensitivity than that of the second embodiment can be realized. In the third embodiment, if there appears the voltage difference between the input nodes Nin1 and Nin2, there occurs the voltage difference between the node N1 and node N2 which are disposed between the PMOSs 5, 6 and the PMOSs 1, 2.

If the voltage on the data bus DB2 is lower than that on the data bus DB1, namely, the voltage at the input node Nin2 is lower than that at the input node Nin1, there occurs the difference between the voltage applied to the gate of the PMOS1 and that applied to the gate of the PMOS2. Accordingly, the current flowing between the source and drain of the PMOS1 is larger than that flowing through the source and drain of the PMOS2.

Accordingly, the voltage at the output node Nout1 is higher than that at the output node Nout2. As a result, the current flowing through the source and drain of the PMOS2 becomes still smaller. The current difference between the PMOSs 1 and 2 is further increased. Since the voltage at the output node Nout1 sharply increases relative to that at the output node Nout2, the PMOS2 becomes OFF. As a result, a current I2 flowing through the output node Nout2 is cut off.

Since the voltage ("L level" at the output node Nout2 is inverted by the inverter Inv2 so that "H level" signal is supplied to a gate of the NMOS4, the NMOS4 becomes ON. As a result, the voltage at the output node Nout2 is fixed to "L level".

Since when the voltage at the output node Nout1 increases, the output of the inverter Inv1 is changed to "L level", the NMOS3 becomes OFF. As a result, a current I1 flowing through the output node Nout1 is cut off. Consequently, the voltage at the output node Nout1 is fixed to "H level".

When the voltages at the output nodes Nout1 and Nout2 are respectively fixed in such a manner, the current paths thereof are naturally cut off, thereby restraining a feedthrough current.

The third embodiment explained the case where the output node Nout1 is at "H level" and the output node Nout2 is at "L level", namely, "L level" data is outputted from the output terminal DO1 and "H level" data is outputted from the output terminal DO2.

It is easily understood that in the alternative, when the output node Nout1 is "L level" and the output node Nout2 is at "H level", namely, "H level" data is outputted from the output terminal D01 and "L level" data is outputted from the output terminal DO2.

That is, when the voltages at the output nodes Nout1 and Nout2 are fixed, the PMOS1 and the NMOS4 are respectively OFF, and hence the current paths thereof are naturally cut off, thereby restraining a feedthrough current.

In the third embodiment, there occurs a voltage difference between the output node Nout1 and the output node Nout2 which difference is substantially the same as the power supply voltage (voltage difference between the power supply voltage and ground voltage) in the same manner as the first embodiment. That is, it is possible to obtain an output having a logical amplitude which is substantially the same as the power supply voltage.

Since switching circuits SW1 and SW2 are disposed between the power supply voltage and the ground voltage in the same manner as the first embodiment, it is controlled such that when one of the switching circuits SW1 and SW2 is ON, the other is OFF, so that the current flowing in the circuit is sharply reduced. The amount of current flowing in the circuit of the amplifier of the third embodiment is very small compared with the conventional circuit through which a current flows regularly during a sensing operation (during the activation of a control signal) although it is conceivable the presence of a transit current which flows at the instant when the switching circuit SW1 is ON.

Further, since there exist current paths until the voltages at the output nodes are fixed by the NMOSs 3 and 4 which are controlled by the outputs of the inverters Inv1 and Inv2 in the same manner as the second embodiment, the noise immunity at the output terminals DO1 and DO2 improves.

Further, acceding to the third embodiment, since the PMOSs 5 and 6 also contribute to the amplifying operation, an amplifier having higher sensitivity than that of the second embodiment can be realized.

Figure 5:
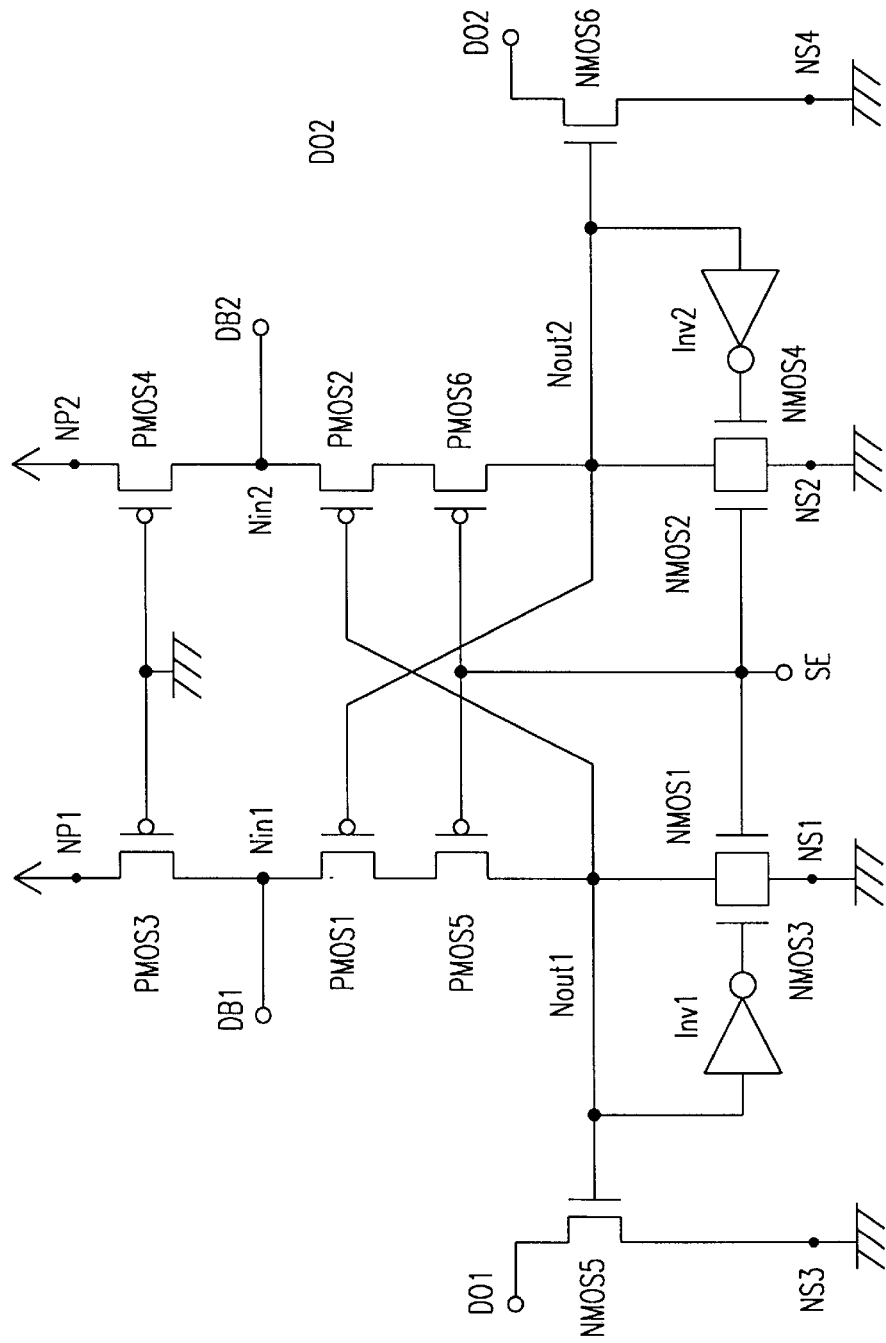
FIG. 5 is a partial circuit diagram for explaining a fourth embodiment of the invention.

An amplifier for a semiconductor device and a method of controlling the same according to a fourth embodiment of the invention will be now described hereinafter with respect to FIG. 5. In the fourth embodiment, components which are the same as those in the first to third embodiments are denoted by the same reference numerals, and explanation thereof may be sometimes omitted. The circuit construction and the operation of the amplifier which directly relates to the invention will be explained.

An amplifier 23 includes input nodes Nin1 and Nin2 to which input data is supplied through data buses DB1 and DB2. PMOSs 3 and 4 are respectively disposed between the input nodes Nin1, Nin2 and power supply voltage nodes Np1 and Np2 to which a power supply voltage Vdd is applied from the power supply.

Since the ground voltage Vss is applied to gates of the PMOSs 3 and 4, the PMOSs 3 and 4 become always ON to serve as a load.

Source of the PMOSs 1 and 2 are respectively connected to the input nodes Nin1 and Nin2. Gates of the PMOSs 1 and 2 are respectively connected to the output nodes Nout2 and Nout1, and drains thereof are connected to sources of PMOSs 5 and 6 serving as a switching circuit SW1. The PMOSs 5 and 6 connect or disconnect between the drains of PMOSs 1, 2, and the output nodes Nout1, Nout2 in response to a control signal SE which is supplied to gates thereof.

NMOSs 1 and 2 serving as a switching circuit SW2 are respectively disposed between the output nodes Nout1 and Nout2 and the reference voltage nodes Ns1 and Ns2 to which the reference voltage Vss is applied from a reference power supply.

The NMOSs 1 and 2 connect or disconnect between the output nodes Nout1, Nout2 and reference voltage nodes Ns1 Ns2 in response to the control signal SE. The control signal SE employed by the NMOSs 1 and 2 is the same as the control signal which is supplied to the PMOSs 5 and 6. Accordingly, it is controlled such that when the PMOSs 5 and 6 are ON, the NMOSs 1 and 2 are OFF while when the PMOSs 5 and 6 are OFF, the NMOSs 1 and 2 are ON.

Output terminals DO1 and DO2 are respectively connected to the output nodes Nout1 and Nout2 and inverters Inv1 and Inv2 so as to output the voltage at the output nodes outside the amplifier 23. These inverters are respectively CMOS inverters.

The inverters Inv1 and Inv2 are connected to the output nodes Nout1 and Nout2 at input terminals thereof and connected to the gates of the NMOSs 3 and 4 at output terminals thereof.

The NMOSs 3 and 4 are respectively connected between the output nodes Nout1, Nout2 and the reference voltage nodes Ns1, Ns2 in parallel with the NMOSs 1 and 2.

Further, the fourth embodiment is different from the second embodiment in that there are provided the NMOSs 5 and 6 connected to the output nodes and respectively serving as an output buffer circuit.

A gate of the NMOS 5 is connected to the input terminal of the inverter Inv1 and the output node Nout1, a source thereof is connected to the reference voltage node NS3 to which a reference voltage is applied, and a drain thereof is connected to the output terminal DO1.

A gate of the NMOS 6 is connected to the input terminal of the inverter Inv2 and the output node Nout2, a source thereof is connected to the reference voltage node NS4 to which a reference voltage is applied, and a drain thereof is connected to the-output terminal DO2.

Next, the operation of the amplifier 23 will be also explained with reference to the timing chart in FIG. 3. In FIG. 3, denoted by "H level" is a power supply voltage and denoted by "L level" is a ground voltage.

In the amplifier, 23, a precharge period is set before, data is read. Since the data buses DB1 and DB2 are precharged with the power supply voltage Vdd during the precharge period, the input nodes Nin1 and Nin2 are precharged with the power supply voltage. Since the control signal SE is "H level" also during this period, the PMOSs 5 and 6 becomes OFF but the NMOSs 1 and 2 becomes ON. Accordingly, the output nodes Nout1 and Nout2 are respectively precharged with "L level".

If data is read and the voltage difference occurs between the data buses DB1 and DB2, the control signal SE becomes "L level". Accordingly, the PMOSs 5 and 6 becomes ON but the NMOSs 1 and 2 becomes OFF.

The voltage difference between the data buses DB1 and DB2, namely, the voltage difference between input nodes Nin1 and Nin2 is amplified by the differential amplifier 23, and appears at the output nodes Nout1 and Nout2.

If the voltage on the data bus DB2 is lower than that on the data bus DB1, namely, the voltage at the input node Nin2 is lower than that at the input node Nin1, there occurs the difference between the voltage applied to the gate of the PMOS1 and that applied to the gate of the PMOS2. Accordingly, the current flowing between the source and drain of the PMOS1 is larger than that flowing through the source and drain of the PMOS2.

Accordingly, the voltage at the output node Nout1 is higher than that at the output node Nout2. As a result, the current flowing through the source and drain of the PMOS2 becomes still smaller. The current difference between the PMOSs 1 and 2 is further increased. Since the voltage at the output node Nout1 sharply increases relative to that at the output node Nout2, the PMOS2 becomes OFF. As a result, a current I2 flowing through the output node Nout2 is cut off.

Since the voltage ("L level" ) at the output node Nout2 is inverted by the inverter Inv2 so that "H level" signal is supplied to a gate of the NMOS4, the NMOS4 becomes ON. As a result, the voltage at the output node Nout2 is fixed to "L level".

Since when the voltage at the output node Nout1 increases, the output of the inverter Inv1 is changed to "L level", the NMOS3 becomes OFF. As a result, a current I1 flowing through the output node Nout1 is cut off. Consequently, the voltage at the output node Nout1 is fixed to "H level".

When the voltages at the output nodes Nout1 and Nout2 are respectively fixed in such a manner, the current paths thereof are naturally cut off, thereby restraining a feedthrough current.

Since the output node Nout1 is at "H level" and the output node Nout2 is at "L level", the NMOS 5 becomes ON and the NMOS 6 becomes OFF. Accordingly, "L level" data is outputted from the output terminal DO1 and "H level" data is outputted from the output terminal DO2.

That is, when the voltages at the output nodes Nout1 and Nout2 are fixed, the PMOS2 and the NMOS4 are respectively OFF, and hence the current paths thereof are naturally cut off, thereby restraining a feedthrough current.

In the fourth embodiment, there occurs a voltage difference between the output node Nout1 and the output node Nout2 which difference is substantially the same as the power supply voltage (voltage difference between the power supply voltage and ground voltage). That is, it is possible to obtain an output having a logical amplitude which is substantially the same as the power supply voltage.

Since the switching circuits SW1 and SW2 are disposed between the power, supply voltage and the ground voltage in the same manner as the first embodiment, they are controlled such that when one of the switching circuits SW1 and SW2 is ON, the other is OFF, so that the current flowing in the circuit is sharply reduced. The, amount of current flowing in the circuit of the amplifier of the fourth embodiment is very mall compared with the conventional circuit through, which a current flows regularly during a sensing operation (during the activation of a control signal) although it is conceivable the presence of a transit current which flows at the instant when the switching circuit SW1 is ON.

Still further, since the NMOSs 5 and 6 function as a buffer circuit according to the fourth embodiment, namely, output data lines connected to the output terminals are not directly connected to the output nodes of the amplifier, the output data line having large parasitic capacitance does not influence the feedthrough current. Accordingly, it is possible to realize an amplifier through which a feedthrough current flows less than that of the second embodiment.

Although the invention has been described with reference to exemplified embodiments set forth above, the description is not limited to such embodiments. Various modifications of the exemplified embodiments and other embodiments of the invention will become evident for a person skilled in the art from the description set forth above. Accordingly, it is conceived that attached claims cover all the modifications and other embodiments which are included in the actual scope of the invention.

What is claimed is:

1. An amplifier comprising:

a first input node to which first data having a first voltage is supplied;

a second input node to which second data having a second voltage which is different from the first voltage is supplied;

a power supply voltage node to which a power supply voltage is applied;

a load circuit comprising a first load element coupled between the power supply voltage node and the first input node, and a second load element coupled between the power supply voltage node and the second input node;

a first output node at which a voltage corresponding to a voltage at the first input node appears;

a second output node at which a voltage corresponding to a voltage at the second input node appears;

a reference voltage node at which a reference voltage that is sufficiently lower than the power supply voltage is applied, said reference voltage node being connectable to the first and second output nodes;

a first switching circuit comprising a first switching element disposed between the first input node and the first output node, and a second switching element disposed between the second input node and the second output node; and a second switching circuit comprising a third switching element disposed between the first output node and the reference voltage node, and a fourth switching element disposed between the second output node and the reference voltage node, wherein the first and second switching elements are substantially made non-conductive and the third and fourth switching elements are made conductive before the first and second data are supplied to the first input node and the second input node so that voltages at the first and second output nodes are substantially set to the reference voltage, and wherein the first and second switching elements are made conductive and the third and fourth switching elements are substantially made non-conductive after the first and second data are supplied to the first input node and the second input node so that voltages at the first and second output nodes are changed from the reference voltage to voltages corresponding to the first and second data which are supplied to the first and second input nodes.

2. The amplifier according to claim 1, wherein the first and second switching elements of the first switching circuit comprise first and second p-channel MOS transistors, the third and fourth switching elements of the second switching circuit comprise first and second n-channel MOS transistors, wherein a control signal is supplied to gate electrodes of the first and, second p-channel MOS transistors and to gate electrodes of the first and second n-channel MOS transistors, the amplifier further comprising:

a third p-channel MOS transistor which is disposed between the first input node and the first p-channel MOS transistor, and which includes a gate electrode connected to the second output node; and a fourth p-channel MOS transistor which is disposed between the second input node and the second p-channel MOS transistor, and which includes a gate electrode connected to the first output node;

wherein the control signal has substantially a same voltage as the power supply voltage before the first data and second data are supplied to the first input node and the second input node, and wherein the control signal has substantially the same voltage as the reference voltage after the first data and second data are supplied to the first input node and the second input node.

3. The amplifier according to claim 1, wherein the first and second switching elements of the first switching circuit comprise first and second p-channel MOS transistors, the third and fourth switching elements of the second switching circuit comprise first and second n-channel MOS transistors, wherein a control signal is supplied to gate electrodes of the first and second p-channel MOS transistors and to gate electrodes of the first and second n-channel MOS transistors, the amplifier further comprising:

a third p-channel MOS transistor which is disposed between the first output node and the first p-channel MOS transistor, and which includes a gate electrode connected to the second output node; and a fourth p-channel MOS transistor which is disposed between the second output node and thy second p-channel MOS transistor, and which includes a gate electrode connected to the first output node, wherein the control signal has substantially a same voltage as the power supply voltage before the first and second data are supplied to the first input node and the second input node, and wherein the control signal has substantially a same voltage as the reference voltage after the first and second data are supplied to the first input node and the second input node.

4. The amplifier according to claim 2, further comprising:

a third n-channel MOS transistor disposed between the first output node and the reference voltage node and connected in parallel with the first n-channel MOS transistor;

a fourth n-channel MOS transistor disposed between the second output node and the reference voltage node and connected in parallel with the second n-channel MOS transistor;

a first inverter having an input terminal connected to the first output node and having an output terminal connected to a gate electrode of the third n-channel MOS transistor; and a second inverter having an input terminal connected to the second output node and having an output terminal connected to a gate electrode of the fourth n-channel MOS transistor, wherein the first load element is composed of a fifth p-channel MOS transistor, and the second load element is composed of a sixth p-channel MOS transistor, wherein the reference voltage is applied to gate electrodes of the fifth and sixth p-channel MOS transistors.

5. The amplifier according to claim 3, further comprising:

a third n-channel MOS transistor disposed between the first output node and the reference voltage node and connected in parallel with the first n-channel MOS transistor;

a fourth n-channel MOS transistor disposed between the second output node and the reference voltage node and connected in parallel with the second n-channel MOS transistor;

a first inverter having an input terminal connected to the first output node at an input terminal thereof, and having an output terminal connected to a gate electrode of the third n-channel MOS transistor; and a second inverter having an input terminal connected to the second output node and having an output terminal connected to a gate electrode of the fourth n-channel MOS transistor, wherein the first load element is composed of a fifth p-channel MOS transistor, and the second load element is composed of a sixth p-channel MOS transistor, wherein the reference voltage is applied to gate electrodes of the fifth and sixth p-channel MOS transistors.

6. The amplifier according to claim 4, further comprising:

a fifth n-channel MOS transistor disposed between a first amplifier output terminal and the reference voltage node, and having a gate connected to the first output node; and a sixth n-channel MOS transistor disposed between a second amplifier output terminal and the reference voltage node, and having a gate connected to the second output node.

7. The amplifier according to claim 5, further comprising:

a fifth n-channel MOS transistor disposed between a first amplifier output terminal and the reference voltage node, and having a gate connected to the first output node; and a sixth n-channel MOS transistor disposed between a second amplifier output terminal and the reference voltage node, and having a gate connected to the second output node.

8. A method of controlling an amplifier having an input terminal to which input data is supplied and an output terminal from which output data corresponding to the input data is output, the input and output terminals being disposed between a power supply node to which a power supply voltage is applied and a reference voltage node to which a reference voltage is applied, comprising:

connecting the output terminal and the reference voltage node to each other and disconnecting the input terminal and the output terminal from each other, before the input data is supplied to the input terminal; and disconnecting the output terminal and the reference voltage node from each other and connecting the input terminal and the output terminal to each other, after the input data is supplied to the input terminal.

9. An amplifier comprising:

a first group composed of a first input node, a first p-channel MOS transistor and a first output node respectively disposed serially between a power supply, voltage and a reference voltage; and a second group composed of a second input node, a second p-channel MOS transistor and a second output node respectively disposed serially between the power supply voltage and the reference voltage, wherein a gate electrode of the first p-channel MOS transistor is connected to the second output node, and a gate electrode of the second p-channel MOS transistor is connected to the first output node, and wherein a voltage difference between a first voltage and a second voltage which are respectively applied to the first and second nodes at the same time is amplified and output from the first and second output nodes as third and fourth voltages, the first and second p-channel MOS transistors being electrically disconnected from the first and second output nodes the first and second output nodes being electrically connected to the reference voltage node before the first and second voltages are applied to the first and second input nodes, and the first and second p-channel MOS transistors being electrically connected to the first and second output nodes and the first and second output nodes being electrically disconnected from the reference voltage node when the first and second voltages are applied to first and second the input nodes.

10. The amplifier according to claim 9, further comprising:

a third p-channel MOS transistor disposed between the first p-channel MOS transistor and the first output node;

a fourth p-channel MOS transistor disposed between the second p-channel MOS transistor and the second output node;

a first n-channel MOS transistor disposed between the first output node and the reference voltage; and a second n-channel MOS transistor disposed between the second output node and the reference voltage and, a common control signal being supplied to gate electrodes of the third and fourth p-channel MOS transistors and to gate electrodes of the first and second n-channel MOS transistors.

11. The amplifier according to claim 10, further comprising:

a load circuit composed of a fifth p-channel MOS transistor disposed, between the first input node and the power supply node and a sixth p-channel MOS transistor disposed between the second input node and the power supply node, wherein the reference voltage is applied to gate electrodes of the fifth and sixth p-channel MOS transistors;

a third n-channel MOS transistor disposed between the first output node and the reference voltage node and connected in parallel with the first n-channel MOS transistor;

a fourth n-channel MOS transistor disposed between the second output node and the reference voltage node and connected in parallel with the second n-channel MOS transistor;

a first inverter having a input terminal connected to the first output node and having an output terminal connected to a gate electrode of the third n-channel MOS transistor; and a second inverter having an output terminal connected to the second output node and having a output terminal connected to a gate electrode of the fourth n-channel MOS transistor.

12. The amplifier according to claim 11, further comprising:

a fifth n-channel MOS transistor disposed between a first amplifier output terminal and the reference voltage node, and having a gate electrode connected to the first output node; and a sixth n-channel MOS transistor disposed between a second amplifier output terminal and the reference voltage node, and having a gate electrode connected to the second output node.

\* \* \* \* \*